(12) United States Patent
Yan et al.

(10) Patent No.: US 11,894,811 B2
(45) Date of Patent: Feb. 6, 2024

(54) OPERATIONAL AMPLIFIER, RADIO FREQUENCY CIRCUIT, AND ELECTRONIC DEVICE

(71) Applicant: Huawei Technologies Co., Ltd., Shenzhen (CN)

(72) Inventors: Taotao Yan, Shanghai (CN); Kerou Wang, Shanghai (CN); Wei Wu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 561 days.

(21) Appl. No.: 17/135,331

(22) Filed: Dec. 28, 2020

(65) Prior Publication Data

US 2021/0119586 A1 Apr. 22, 2021

Related U.S. Application Data

(63) Continuation of application No. PCT/CN2018/093824, filed on Jun. 29, 2018.

(51) Int. Cl.
*H03F 3/45* (2006.01)
*H03F 1/42* (2006.01)

(52) U.S. Cl.
CPC .............. *H03F 1/42* (2013.01); *H03F 3/4521* (2013.01); *H03F 2200/36* (2013.01); *H03F 2200/451* (2013.01)

(58) Field of Classification Search
CPC ...... H03F 1/42; H03F 3/4521; H03F 2200/36; H03F 2200/451; H03F 3/211; H03F 3/45183; H03F 2200/294; H03F 2203/45332; H03F 2203/45366; H03F 2203/45644; H03F 3/195; H03F 3/45475
(Continued)

(56) References Cited

U.S. PATENT DOCUMENTS

| 5,767,542 A | 6/1998 | Nakamura | |
| 7,795,961 B2 * | 9/2010 | Kojima | G09G 3/20 |
| | | | 330/9 |

(Continued)

FOREIGN PATENT DOCUMENTS

| CN | 101635560 A | 1/2010 |
| CN | 102611411 A | 7/2012 |

(Continued)

*Primary Examiner* — Andrea Lindgren Baltzell
*Assistant Examiner* — Khiem D Nguyen
(74) *Attorney, Agent, or Firm* — Conley Rose, P.C.

(57) ABSTRACT

An operational amplifier includes a first amplifying unit, a second amplifying unit, a current source, a first compensation capacitor, and a second compensation capacitor. The first amplifying unit includes a first input transistor, a second input transistor, a third input transistor, and a fourth input transistor. The second amplifying unit includes a fifth input transistor, a sixth input transistor, a seventh input transistor, and an eighth input transistor. One end of the first compensation capacitor is coupled to a drain of the seventh input transistor, and the other end of the first compensation capacitor is coupled to a gate of the eighth input transistor. One end of the second compensation capacitor is coupled to a drain of the eighth input transistor, and the other end of the second compensation capacitor is coupled to a gate of the seventh input transistor.

20 Claims, 5 Drawing Sheets

(58) Field of Classification Search
USPC .......................................... 330/252, 253, 254
See application file for complete search history.

(56) References Cited

U.S. PATENT DOCUMENTS

| | | |
|---|---|---|
| 2002/0175763 A1 | 11/2002 | Dasgupta et al. |
| 2005/0270098 A1 | 12/2005 | Zhang et al. |
| 2012/0286860 A1 | 11/2012 | Park et al. |
| 2015/0061767 A1 | 3/2015 | Francis |
| 2015/0341004 A1 | 11/2015 | Oishi |
| 2017/0093349 A1 | 3/2017 | Elliott et al. |
| 2018/0097488 A1 | 4/2018 | Giuffredi et al. |

FOREIGN PATENT DOCUMENTS

| | | |
|---|---|---|
| CN | 104660195 A | 5/2015 |
| CN | 105099382 A | 11/2015 |
| CN | 106559053 A | 4/2017 |
| WO | 2005119907 A2 | 12/2005 |

\* cited by examiner

OPERATIONAL AMPLIFIER, RADIO FREQUENCY CIRCUIT, AND ELECTRONIC DEVICE

CROSS-REFERENCE TO RELATED APPLICATIONS

This application is a continuation application of International Patent Application No. PCT/CN2018/093824 filed on Jun. 29, 2018, the disclosure of which is hereby incorporated by reference in its entirety.

TECHNICAL FIELD

This application relates to the communications field, and in particular, to an operational amplifier, a radio frequency circuit, and an electronic device.

BACKGROUND

An operational amplifier is a basic unit of an analog radio frequency chip, which is widely used in circuit modules such as a filter and an amplifier. Basic performance of the operational amplifier includes power consumption, gain, unit gain bandwidth (GBW), phase margin, and the like. Signal bandwidth of a fifth generation (5G) communications protocol exceeds 100 megahertz (MHz) or even reaches over 1 gigahertz (GHz). Compared with second generation (2G)/third generation (3G)/fourth generation (4G) networks, an operational amplifier of a signal channel is required to have a higher gain and bandwidth. Therefore, in a 5G communications system, an operational amplifier is required to have relatively high GBW, and one of indicators for measuring performance of the operational amplifier is the GBW. Higher GBW indicates better performance of the operational amplifier, and lower GBW indicates poorer performance of the operational amplifier. However, GBW of operational amplifiers in other approaches is generally low.

SUMMARY

To increase GBW of an operational amplifier, this application provides an operational amplifier, a radio frequency circuit, and an electronic device. The technical solutions are as follows.

According to a first aspect, an embodiment of this application provides an operational amplifier, where the operational amplifier includes a first amplifying unit a, a second amplifying unit b, a current source H, a first compensation capacitor C1, and a second compensation capacitor C2. The first amplifying unit a includes a first transistor M1, a second transistor M2, a third transistor M3, and a fourth transistor M4. The second amplifying unit b includes a fifth transistor M5, a sixth transistor M6, a seventh transistor M7, and an eighth transistor M8.

One end of the current source H is coupled to a first end, and the other end of the current source H is separately coupled to a source of the first transistor M1 and a source of the second transistor M2. A gate of the first transistor M1 and a gate of the sixth transistor M6 are separately coupled to a first voltage input end I1, a gate of the second transistor M2 and a gate of the fifth transistor M5 are separately coupled to a second voltage input end I2, and the first voltage input end I1 and the second voltage input end I2 are differential voltage signal input ends. Both a drain of the first transistor M1 and a drain of the third transistor M3 are coupled to a gate of the eighth transistor M8. Both a drain of the second transistor M2 and a drain of the fourth transistor M4 are coupled to a gate of the seventh transistor M7, a gate of the third transistor M3 is coupled to a gate of the fourth transistor M4, and both a source of the third transistor M3 and a source of the fourth transistor M4 are coupled to a second end. Both a source of the fifth transistor M5 and a source of the sixth transistor M6 are coupled to the first end, and a drain of the fifth transistor M5 and a drain of the seventh transistor M7 are coupled to one end of the first compensation capacitor C1, a drain of the sixth transistor M6 and a drain of the eighth transistor M8 are coupled to one end of the second compensation capacitor C2, and both a source of the seventh transistor M7 and a source of the eighth transistor M8 are coupled to the second end. The other end of the first compensation capacitor C1 is coupled to the gate of the eighth transistor M8, and the other end of the second compensation capacitor C2 is coupled to the gate of the seventh transistor M7. The drain of the fifth transistor M5 and the drain of the sixth transistor M6 are differential voltage signal output ends, and are configured to output differential signals.

Because the one end of the first compensation capacitor C1 is coupled to the drain of the seventh transistor M7, and the other end of the first compensation capacitor C1 is coupled to the gate of the eighth transistor M8, the first compensation capacitor C1 may partially or fully cancel capacitance of a first parasitic capacitor C3. In this way, load capacitance at a first output end of the first amplifying unit a is reduced. In addition, because the one end of the second compensation capacitor C2 is coupled to the gate of the seventh transistor M1, and the other end of the second compensation capacitor C2 is coupled to the drain of the eighth transistor M2, the second compensation capacitor C2 may partially or fully cancel capacitance of a second parasitic capacitor C4. In this way, load capacitance of a second output end O2 of the first amplifying unit a may be reduced, and GBW of the operational amplifier can be increased.

In a possible implementation of the first aspect, a capacitance value of the first compensation capacitor C1 is equal to a capacitance value of the second compensation capacitor C2. This ensures symmetry of the second amplifying unit b.

In a possible implementation of the first aspect, the first amplifying unit a further includes a first resistor R1 and a second resistor R2. One end of the first resistor R1 is coupled to the drain of the first transistor M1 and the drain of the third transistor M3, and the other end of the first resistor R1, one end of the second resistor R2, and the gate of the third transistor M3 are coupled to the gate of the fourth transistor M4. The other end of the second resistor R2 is coupled to the drain of the second transistor M2 and the drain of the fourth transistor M4.

In a possible implementation of the first aspect, the second amplifying unit b further includes a first parasitic capacitor C3 and a second parasitic capacitor C4. One end of the first parasitic capacitor C3 is coupled to the gate of the seventh transistor M7, and the other end of the first parasitic capacitor C3 is coupled to the second end. One end of the second parasitic capacitor C4 is coupled to the gate of the eighth transistor M8, and the other end of the second parasitic capacitor C4 is coupled to the second end.

In a possible implementation of the first aspect, the operational amplifier further includes a third compensation capacitor C5 and a fourth compensation capacitor C6. One end of the third compensation capacitor C5 is coupled to the drain of the first transistor M1, and the other end of the third compensation capacitor C5 is coupled to the gate of the second transistor M2. One end of the fourth compensation capacitor C6 is coupled to the drain of the second transistor M2, and the other end of the fourth compensation capacitor C6 is coupled to the gate of the first transistor M1.

Because the one end of the third compensation capacitor C5 is coupled to the drain of the first transistor M1, and the other end of the third compensation capacitor C5 is coupled to the gate of the second transistor M2, the third compensation capacitor C5 may partially or fully cancel capacitance of a third parasitic capacitor C7. In addition, because the one end of the fourth compensation capacitor C6 is coupled to the gate of the first transistor M1, and the other end of the fourth compensation capacitor C6 is coupled to the drain of the second transistor M2, the fourth compensation capacitor C6 may partially or fully cancel capacitance of a fourth parasitic capacitor C8. In this way, stability of the operational amplifier can be increased.

In a possible implementation of the first aspect, a capacitance value of the third compensation capacitor C5 is equal to a capacitance value of the fourth compensation capacitor C6. This ensures symmetry of the first amplifying unit a.

In a possible implementation of the first aspect, the first amplifying unit a further includes the third parasitic capacitor C7 and the fourth parasitic capacitor C8. One end of the third parasitic capacitor C7 is coupled to the gate of the first transistor M1, and the other end of the third parasitic capacitor C7 is grounded. One end of the fourth parasitic capacitor C8 is coupled to the gate of the second transistor M2, and the other end of the fourth parasitic capacitor C8 is grounded.

In a possible implementation of the first aspect, the second amplifying unit b further includes a first input capacitor C9, a second input capacitor C10, a third resistor R3, and a fourth resistor R4. One end of the first input capacitor C9 is coupled to the gate of the second transistor M2, the other end of the first input capacitor C9 is coupled to one end of the third resistor R3 and the gate of the fifth transistor M5, and the other end of the third resistor R3 is coupled to the second voltage end. One end of the second input capacitor C10 is coupled to the gate of the first transistor M1, the other end of the second input capacitor C10 is coupled to one end of the fourth resistor R4 and the gate of the sixth transistor M6, and the other end of the fourth resistor R4 is coupled to the second voltage end.

In a possible implementation of the first aspect, the first end is a first voltage end, and the second end is a ground end. The first transistor M1, the second transistor M2, the fifth transistor M5, and the sixth transistor M6 are all P-type transistors. The third transistor M3, the fourth transistor M4, the seventh transistor M7, and the eighth transistor M8 are all N-type transistors.

In a possible implementation of the first aspect, the first end is a ground end, and the second end is a first voltage end. The first transistor M1, the second transistor M2, the fifth transistor M5, and the sixth transistor M6 are all N-type transistors. The third transistor M3, the fourth transistor M4, the seventh transistor M7, and the eighth transistor M8 are all P-type transistors.

In a possible implementation of the first aspect, an amplification coefficient of the first transistor M1 is equal to an amplification coefficient of the second transistor M2. An amplification coefficient of the third transistor M3 is equal to an amplification coefficient of the fourth transistor M4. An amplification coefficient of the fifth transistor M5 is equal to an amplification coefficient of the sixth transistor M6. An amplification coefficient of the seventh transistor M7 is equal to an amplification coefficient of the eighth transistor M8. This ensures symmetry of the first amplifying unit a and symmetry of the second amplifying unit b.

According to a second aspect, an embodiment of this application provides a radio frequency circuit, where the radio frequency circuit includes the operational amplifier according to any one of the first aspect or the possible implementations of the first aspect.

According to a third aspect, an embodiment of this application provides an electronic device, where the electronic device includes the radio frequency circuit according to the second aspect.

DESCRIPTION OF EMBODIMENTS

The following further describes in detail the implementations of this application in detail with reference to the accompanying drawings.

Figure 1:
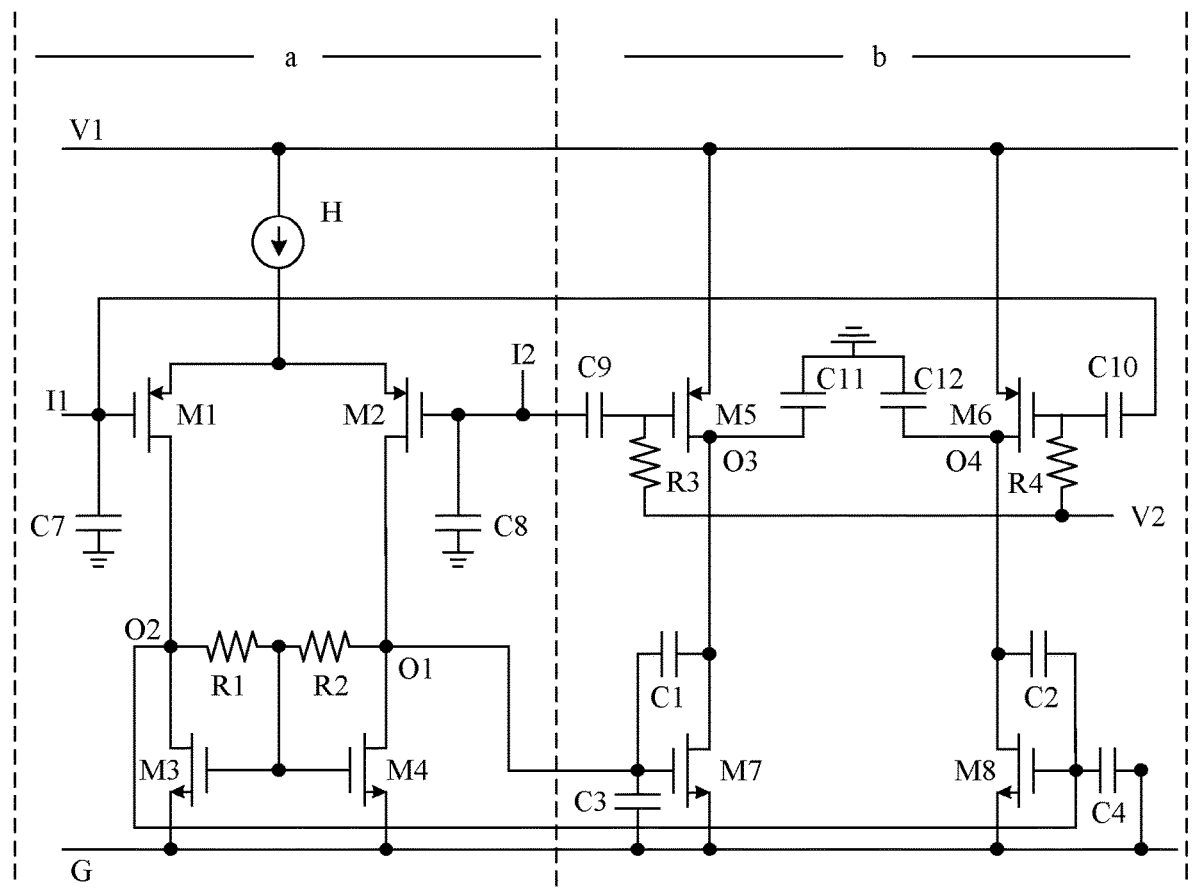
FIG. 1 is a schematic diagram of a structure of an operational amplifier according to an embodiment of this application.

Refer to FIG. 1. FIG. 1 shows an existing operational amplifier. The operational amplifier is a two-stage amplifier, and includes a first amplifying unit a, a second amplifying unit b, a current source H, a first compensation capacitor C1, and a second compensation capacitor C2, where the first amplifying unit a is a first-stage amplifier, and the second amplifying unit b is a second-stage amplifier.

The first amplifying unit a includes a first transistor M1, a second transistor M2, a third transistor M3, and a fourth transistor M4. The second amplifying unit b includes a fifth transistor M5, a sixth transistor M6, a seventh transistor M7, and an eighth transistor M8.

One end of the current source H is coupled to a first voltage end V1, and the other end of the current source H is separately coupled to a source of the first transistor M1 and a source of the second transistor M2. A gate of the first transistor M1 and a gate of the sixth transistor M6 are separately coupled to a first voltage input end I1, a gate of the second transistor M2 and a gate of the fifth transistor M5 are separately coupled to a second voltage input end I2, and the first voltage input end I1 and the second voltage input end I2 are differential voltage signal input ends. Both a drain of the first transistor M1 and a drain of the third transistor M3 are coupled to a gate of the eighth transistor M8. Both a drain of the second transistor M2 and a drain of the fourth transistor M4 are coupled to a gate of the seventh transistor M7, a gate of the third transistor M3 is coupled to a gate of the fourth transistor M4, and both a source of the third transistor M3 and a source of the fourth transistor M4 are grounded (in other words, coupled to a ground end G, and similar descriptions in the following are not repeatedly described).

Both a source of the fifth transistor M5 and a source of the sixth transistor M6 are coupled to the first voltage end V1, and a drain of the fifth transistor M5 and a drain of the seventh transistor M7 are coupled to one end of the first compensation capacitor C1, a drain of the sixth transistor M6 and a drain of the eighth transistor M8 are coupled to one end of the second compensation capacitor C2, and both a source of the seventh transistor M7 and a source of the eighth transistor M8 are grounded. The other end of the first compensation capacitor C1 is coupled to the gate of the seventh transistor M7, and the other end of the second compensation capacitor C2 is coupled to the gate of the eighth transistor M8.

Refer to FIG. 1. The drain of the second transistor M2 is used as a first output end O1 of the first amplifying unit a, and the drain of the first transistor M1 is used as a second output end O2 of the first amplifying unit a. The drain of the fifth transistor M5 is used as a first output end O3 of the second amplifying unit b, and the drain of the sixth transistor M6 is used as a second output end O4 of the second amplifying unit b. In this way, a first voltage signal is input from the first voltage input end I1 of the operational amplifier, and a second voltage signal is input from the second voltage input end I2 of the operational amplifier. The first voltage signal is amplified through the first transistor M1, an amplified third voltage signal is output from the drain of the first transistor M1, and then the third voltage signal is input from the second output end O2 of the first amplifying unit a to the eighth transistor M8 of the second amplifying unit b. The second voltage signal is amplified through the second transistor M2, and an amplified fourth voltage signal is output from the drain of the second transistor M2, and then the fourth voltage signal is input from the first output end O1 of the first amplifying unit a to the seventh transistor M7 of the second amplifying unit b. In addition, the second voltage signal is amplified through the fifth transistor M5, and an amplified fifth voltage signal is output from the drain of the fifth transistor M5. The first voltage signal is amplified through the sixth transistor M6, and an amplified sixth voltage signal is output from the drain of the sixth transistor M6. The fourth voltage signal is amplified through the seventh transistor M7, and an amplified seventh voltage signal is output from the drain of the seventh transistor M7, and the seventh voltage signal and the fifth voltage signal are superimposed into a first output signal and output from the first output end O3 of the second amplifying unit b. The third voltage signal is amplified through the eighth transistor M8, and an amplified eighth voltage signal is output from the drain of the eighth transistor M8, and the eighth voltage signal and the sixth voltage signal are superimposed into a second output signal and output from the second output end O4 of the second amplifying unit b.

Still refer to FIG. 1. The second amplifying unit b may further include a first parasitic capacitor C3 and a second parasitic capacitor C4. One end of the first parasitic capacitor C3 is coupled to the gate of the seventh transistor M7, and the other end of the first parasitic capacitor C3 is grounded. One end of the second parasitic capacitor C4 is coupled to the gate of the eighth transistor M8, and the other end of the second parasitic capacitor C4 is grounded.

In the foregoing operational amplifier, load capacitance of the first output end O1 of the first amplifying unit a is equal to L3+k1*L1, where L3 is a capacitance value of the first parasitic capacitor C3, L1 is a capacitance value of the first compensation capacitor C1, and k1 is an amplification multiple of the first compensation capacitor C1. Load capacitance of the second output end O2 of the first amplifying unit a is equal to L4+k2*L2, where L4 is a capacitance value of the second parasitic capacitor C4, L2 is a capacitance value of the second compensation capacitor C2, and k2 is an amplification multiple of the second compensation capacitor C2. Because the capacitance value of the first compensation capacitor C1 is equal to the capacitance value of the second compensation capacitor C2, the amplification multiple k1 of the first compensation capacitor C1 may be equal to the amplification multiple k2 of the second compensation capacitor C2, where * is a multiplication operation.

Still refer to FIG. 1. The first amplifying unit a further includes a third parasitic capacitor C7, a fourth parasitic capacitor C8, a first resistor R1, and a second resistor R2.

One end of the third parasitic capacitor C7 is coupled to the gate of the first transistor M1, and the other end of the third parasitic capacitor C7 is grounded. One end of the fourth parasitic capacitor C8 is coupled to the gate of the second transistor M2, and the other end of the fourth parasitic capacitor C8 is grounded.

One end of the first resistor R1 is coupled to the drain of the first transistor M1 and the drain of the third transistor M3, and the other end of the first resistor R1, one end of the second resistor R2, and the gate of the third transistor M3 are coupled to the gate of the fourth transistor M4. The other end of the second resistor R2 is coupled to the drain of the second transistor M2 and the drain of the fourth transistor M4.

Still refer to FIG. 1. The second amplifying unit b further includes a first input capacitor C9, a second input capacitor C10, a third resistor R3, and a fourth resistor R4.

One end of the first input capacitor C9 is coupled to the gate of the second transistor M2, the other end of the first input capacitor C9 is coupled to one end of the third resistor R3 and the gate of the fifth transistor M5, and the other end of the third resistor R3 is coupled to a second voltage end V2.

One end of the second input capacitor C10 is coupled to the gate of the first transistor M1, the other end of the second input capacitor C10 is coupled to one end of the fourth resistor R4 and the gate of the sixth transistor M6, and the other end of the fourth resistor R4 is coupled to the second voltage end V2.

In this way, the first voltage signal input from the first voltage input end I1 is input to the gate of the sixth transistor M6 through the second input capacitor C10. During input, the first voltage signal may be delayed for a period of time through the second input capacitor C10 and the fourth resistor R4, and then input to the gate of the sixth transistor M6. In addition, the second voltage signal input from the second voltage input end I2 is input to the gate of the fifth transistor M5 through the first input capacitor C9. During input, the second voltage signal may be delayed for a period of time through the first input capacitor C9 and the third resistor R3, and then input to the gate of the fifth transistor M5.

Optionally, refer to FIG. 1. The first output end O3 of the second amplifying unit b may further be coupled to one end of a first load capacitor C11, and the second output end O4 of the second amplifying unit b may further be coupled to one end of a second load capacitor C12. Both the other end of the first load capacitor C11 and the other end of the second load capacitor C12 are grounded.

Optionally, an amplification coefficient of the first transistor M1 is equal to an amplification coefficient of the second transistor M2. An amplification coefficient of the third transistor M3 is equal to an amplification coefficient of the fourth transistor M4. An amplification coefficient of the fifth transistor M5 is equal to an amplification coefficient of the sixth transistor M6. An amplification coefficient of the seventh transistor M7 is equal to an amplification coefficient of the eighth transistor M8.

Optionally, the capacitance value of the first compensation capacitor C1 is equal to the capacitance value of the second compensation capacitor C2. The capacitance value of the first parasitic capacitor C3 is equal to the capacitance value of the second parasitic capacitor C4. A capacitance value of the third parasitic capacitor C7 is equal to a capacitance value of the fourth parasitic capacitor C8.

Optionally, the first transistor M1, the second transistor M2, the fifth transistor M5, and the sixth transistor M6 are all P-type transistors. The third transistor M3, the fourth transistor M4, the seventh transistor M7, and the eighth transistor M8 are all N-type transistors.

In the foregoing operational amplifier, the load capacitance of the first output end O1 of the first amplifying unit a is equal to L3+k1*L1, and load capacitance of the second output end O2 of the first amplifying unit a is equal to L4+k2*L2. As a result, both the load capacitor at the first output end O1 and the load capacitor at the second output end O2 of the first amplifying unit a are relatively large, causing relatively low GBW of the operational amplifier. To increase the GBW of the operational amplifier, the operational amplifier is designed to obtain an operational amplifier provided in any one of the following embodiments.

Figure 2:
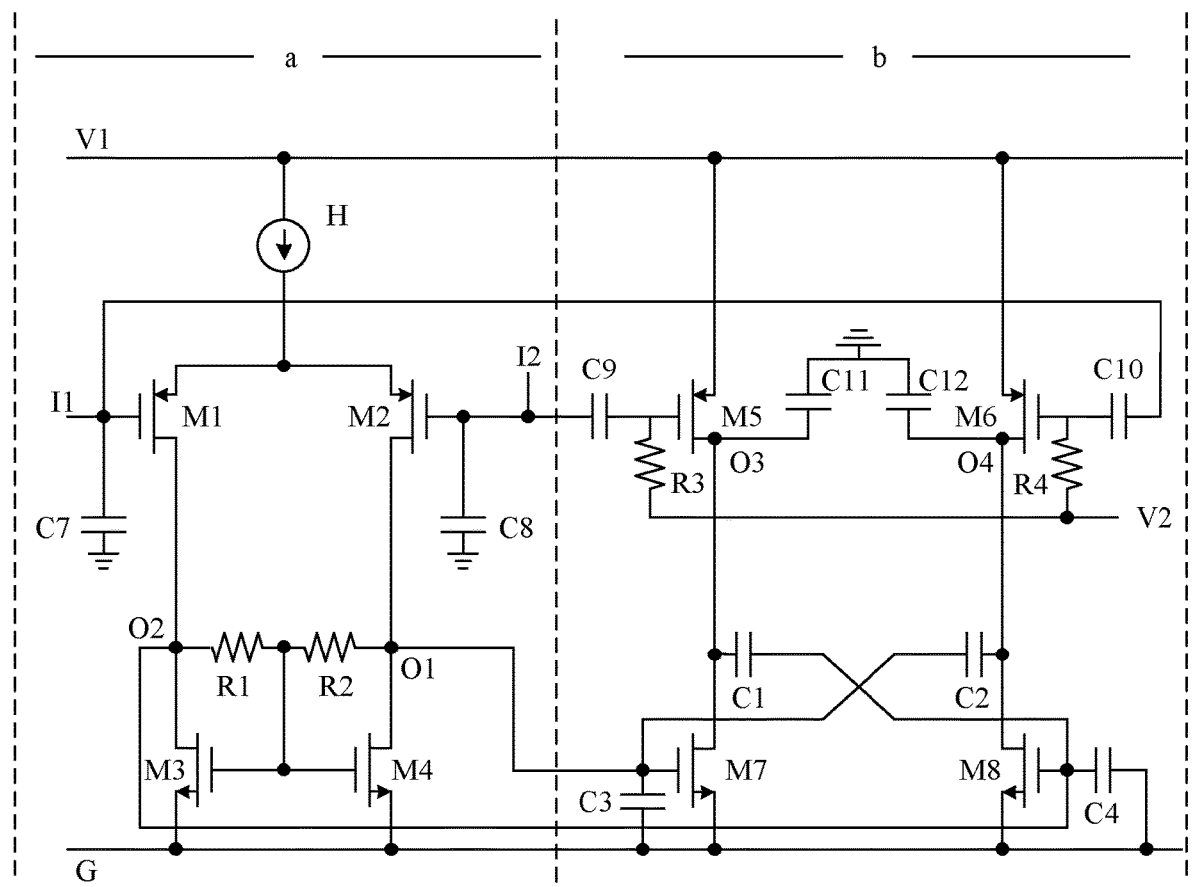
FIG. 2 is a schematic diagram of a structure of another operational amplifier according to an embodiment of this application.

Refer to FIG. 2. An embodiment of this application provides an operational amplifier. The operational amplifier provided in this embodiment includes a first amplifying unit a, a second amplifying unit b, a current source H, a first compensation capacitor C1, and a second compensation capacitor C2. A structure of the first amplifying unit a and a structure of the second amplifying unit b are respectively the same as the structure of the first amplifying unit a and the structure of the second amplifying unit b in the operational amplifier shown in FIG. 1. In addition, a coupling relationship among the first amplifying unit a, the second amplifying unit b, and the current source H that are included in the operational amplifier provided in this embodiment is the same as the coupling relationship among the first amplifying unit a, the second amplifying unit b, and the current source H that are in the operational amplifier shown in FIG. 1. Refer to FIG. 1 and the descriptions in the foregoing embodiment. Details are not described herein again.

A difference between the operational amplifier provided in this embodiment and the operational amplifier shown in FIG. 1 lies in that one end of the first compensation capacitor C1 is coupled to a drain of a seventh transistor M7, and the other end of the first compensation capacitor C1 is coupled to a gate of an eighth transistor M8, and one end of the second compensation capacitor C2 is coupled to a drain of the eighth transistor M8, and the other end of the second compensation capacitor C2 is coupled to a gate of the seventh transistor M7.

Because the one end of the first compensation capacitor C1 is coupled to the drain of the seventh transistor M7, and the other end of the first compensation capacitor C1 is coupled to the gate of the eighth transistor M8, the first compensation capacitor C1 may partially or fully cancel capacitance of a first parasitic capacitor C3. In this way, load capacitance of a first output end O1 of the first amplifying unit a is equal to L3−k1*L1, where L3 is a capacitance value of the first parasitic capacitor C3, L1 is a capacitance value of the first compensation capacitor C1, and k1 is an amplification multiple of the first compensation capacitor C1.

In addition, because the one end of the second compensation capacitor C2 is coupled to the gate of the seventh transistor M7, and the other end of the second compensation capacitor C2 is coupled to the drain of the eighth transistor M8, the second compensation capacitor C2 may partially or fully cancel capacitance of a second parasitic capacitor C4. In this way, load capacitance of a second output end O2 of the first amplifying unit a is equal to L4−k2*L2, where L4 is a capacitance value of the second parasitic capacitor C4, L2 is a capacitance value of the second compensation capacitor C2, and k2 is an amplification multiple of the second compensation capacitor C2.

Compared with the operational amplifier shown in FIG. 1, the operational amplifier provided in this embodiment reduces the load capacitance of the first output end O1 of the first amplifying unit a and the load capacitance of the second output end O2 of the first amplifying unit a. This increases GBW of the operational amplifier.

Figure 3:
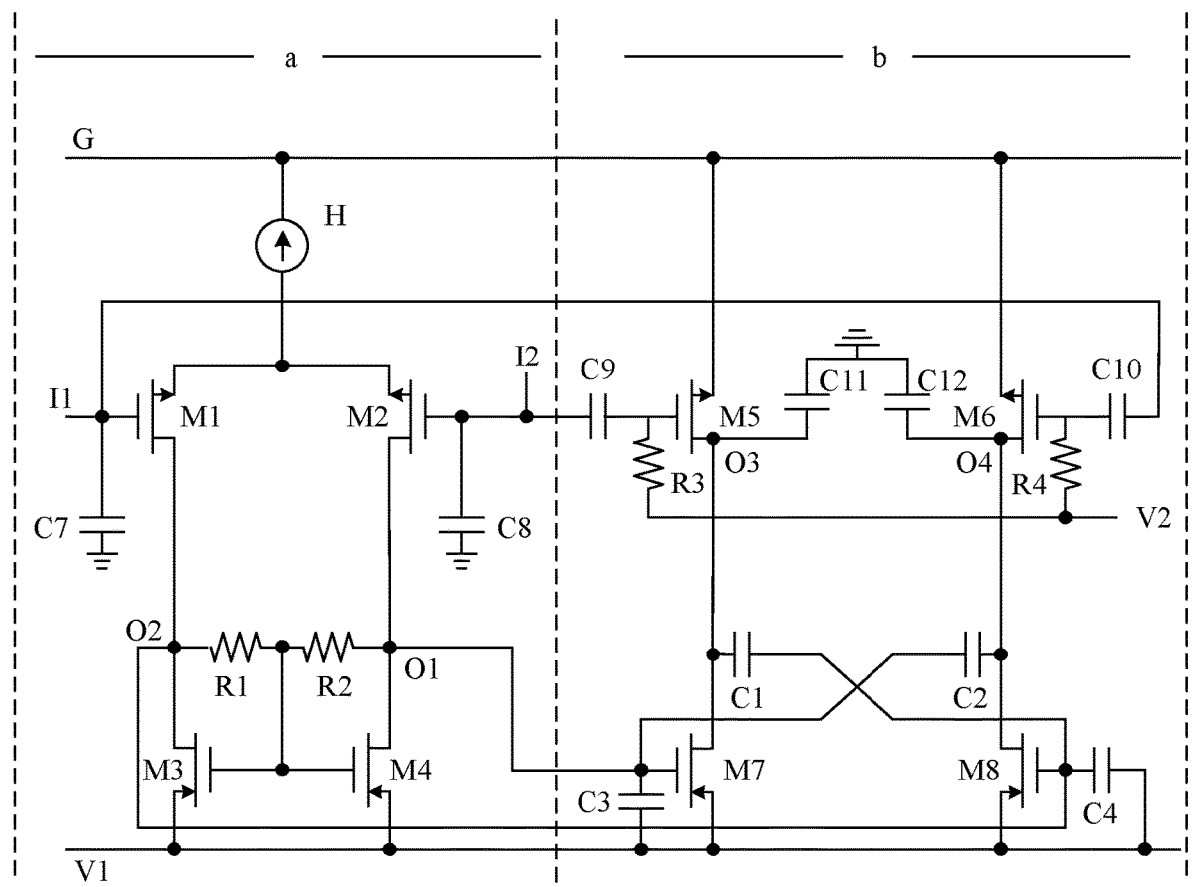
FIG. 3 is a schematic diagram of a structure of another operational amplifier according to an embodiment of this application.

Refer to FIG. 3. An embodiment of this application provides another operational amplifier. The operational amplifier provided in this embodiment includes a first amplifying unit a, a second amplifying unit b, a current source H, a first compensation capacitor C1, and a second compensation capacitor C2. A structure of the first amplifying unit a and a structure of the second amplifying unit b are respectively the same as the structure of the first amplifying unit a and the structure of the second amplifying unit b in the operational amplifier shown in FIG. 2. In addition, a coupling relationship among the first amplifying unit a, the second amplifying unit b, the current source H, the first compensation capacitor C1, and the second compensation capacitor C2 that are included in the operational amplifier provided in this embodiment is the same as the coupling relationship among the first amplifying unit a and the second amplifying unit b, the current source H, the first compensation capacitor C1, and the second compensation capacitor C2 that are in the operational amplifier shown in FIG. 2. Refer to FIG. 2 and the descriptions in the foregoing embodiments. Details are not described herein again.

A difference between the operational amplifier provided in this embodiment and the operational amplifier shown in FIG. 2 lies in that a first transistor M1, a second transistor M2, a fifth transistor M5, and a sixth transistor M6 in the operational amplifier provided in this embodiment may all be N-type transistors, and a third transistor M3, a fourth transistor M4, a seventh transistor M7, and an eighth transistor M8 may all be P-type transistors.

In this way, one end of the current source H is grounded, and the other end of the current source H is coupled to a source of the first transistor M1 and a source of the second transistor M2. Both a source of the fifth transistor M5 and a source of the sixth transistor M6 are grounded, and a source of the third transistor M3, a source of the fourth transistor M4, a source of the seventh transistor M7, and a source of the eighth transistor M8 are all coupled to a first voltage end V1.

In the operational amplifier provided in this embodiment, because one end of the first compensation capacitor C1 is coupled to a drain of the seventh transistor M7, the other end of the first compensation capacitor C1 is coupled to a gate of the eighth transistor M8, the first compensation capacitor C1 may partially or fully cancel capacitance of a first parasitic capacitor C3. In this way, load capacitance of a first output end O1 of the first amplifying unit a is equal to L3−k1*L1, where L3 is a capacitance value of the first parasitic capacitor C3, L1 is a capacitance value of the first compensation capacitor C1, and k1 is an amplification multiple of the first compensation capacitor C1.

Further, because one end of the second compensation capacitor C2 is coupled to a gate of the seventh transistor M7, and the other end of the second compensation capacitor C2 is coupled to a drain of the eighth transistor M8, the second compensation capacitor C2 may partially or fully cancel capacitance of a second parasitic capacitor C4. In this way, load capacitance of a second output end O2 of the first amplifying unit a is equal to L4−k2*L2, where L4 is a capacitance value of the second parasitic capacitor C4, L2 is a capacitance value of the second compensation capacitor C2, and k2 is an amplification multiple of the second compensation capacitor C2.

Compared with the operational amplifier shown in FIG. 1, the operational amplifier provided in this embodiment reduces the load capacitance of the first output end O1 of the first amplifying unit a and the load capacitance of the second output end O2 of the first amplifying unit a. This increases GBW of the operational amplifier.

Figure 4:
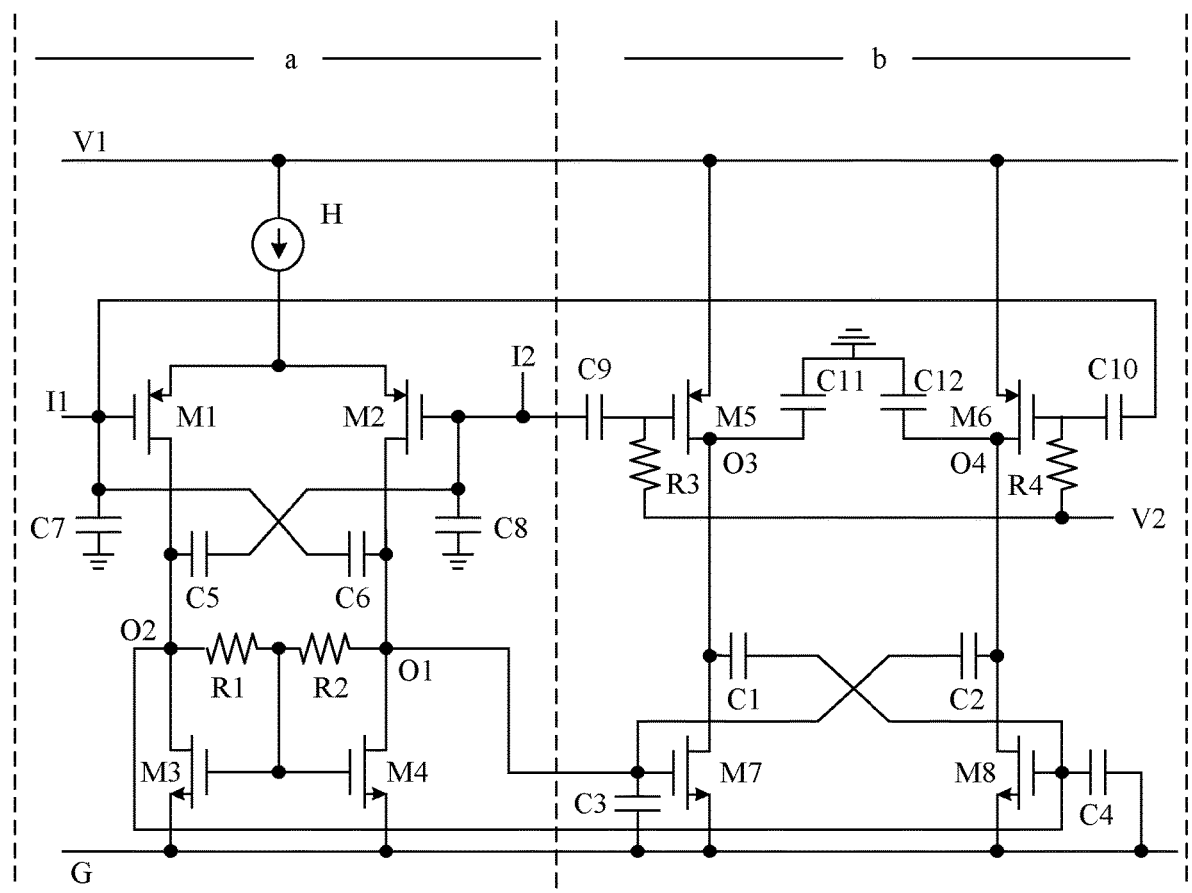
FIG. 4 is a schematic diagram of a structure of another operational amplifier according to an embodiment of this application.

Refer to FIG. 4. An embodiment of this application provides still another operational amplifier. Based on the structure shown in FIG. 2, the operational amplifier further includes a third compensation capacitor C5 and a fourth compensation capacitor C6.

One end of the third compensation capacitor C5 is coupled to a drain of a first transistor M1 of a first amplifying unit a, and the other end of the third compensation capacitor C5 is coupled to a gate of a second transistor M2 of the first amplifying unit a.

One end of the fourth compensation capacitor C6 is coupled to a drain of the second transistor M2, and the other end of the fourth compensation capacitor C6 is coupled to a gate of the first transistor M1.

Because the one end of the third compensation capacitor C5 is coupled to the drain of the first transistor M1, and the other end of the third compensation capacitor C5 is coupled to the gate of the second transistor M2, the third compensation capacitor C5 may partially or fully cancel capacitance of a third parasitic capacitor C7. In addition, because the one end of the fourth compensation capacitor C6 is coupled to the gate of the first transistor M1, and the other end of the fourth compensation capacitor C6 is coupled to the drain of the second transistor M2, the fourth compensation capacitor C6 may partially or fully cancel capacitance of a fourth parasitic capacitor C8. In this way, stability of the operational amplifier can be increased.

Because the operational amplifier provided in this embodiment is obtained based on the operational amplifier shown in FIG. 2, the operational amplifier provided in this embodiment also includes the first amplifying unit a, a second amplifying unit b, a current source H, a first compensation capacitor C1, and a second compensation capacitor C2. A structure of the first amplifying unit a and a structure of the second amplifying unit b are respectively the same as the structure of the first amplifying unit a and the structure of the second amplifying unit b in the operational amplifier shown in FIG. 2. In addition, a coupling relationship among the first amplifying unit a, the second amplifying unit b, the current source H, the first compensation capacitor C1, and the second compensation capacitor C2 that are included in the operational amplifier provided in this embodiment is the same as the coupling relationship among the first amplifying unit a and the second amplifying unit b, the current source H, the first compensation capacitor C1, and the second compensation capacitor C2 that are in the operational amplifier shown in FIG. 2. Refer to FIG. 2 and the descriptions in the foregoing embodiments. Details are not described herein again.

In this embodiment, because one end of the first compensation capacitor C1 is coupled to a drain of a seventh transistor M7, the other end of the first compensation capacitor C1 is coupled to a gate of an eighth transistor M8, the first compensation capacitor C1 may partially or fully cancel capacitance of a first parasitic capacitor C3. In this way, load capacitance of a first output end O1 of the first amplifying unit a is equal to L3−k1*L1, where L3 is a capacitance value of the first parasitic capacitor C3, L1 is a capacitance value of the first compensation capacitor C1, and k1 is an amplification multiple of the first compensation capacitor C1.

Further, because one end of the second compensation capacitor C2 is coupled to a gate of the seventh transistor M7, and the other end of the second compensation capacitor C2 is coupled to a drain of the eighth transistor M8, the second compensation capacitor C2 may partially or fully cancel capacitance of a second parasitic capacitor C4. In this way, load capacitance of a second output end O2 of the first amplifying unit a is equal to L4−k2*L2, where L4 is a capacitance value of the second parasitic capacitor C4, L2 is a capacitance value of the second compensation capacitor C2, and k2 is an amplification multiple of the second compensation capacitor C2.

Compared with the operational amplifier shown in FIG. 1, the operational amplifier provided in this embodiment reduces the load capacitance of the first output end O1 of the first amplifying unit a and the load capacitance of the second output end O2 of the first amplifying unit a. This increases GBW of the operational amplifier.

Figure 5:
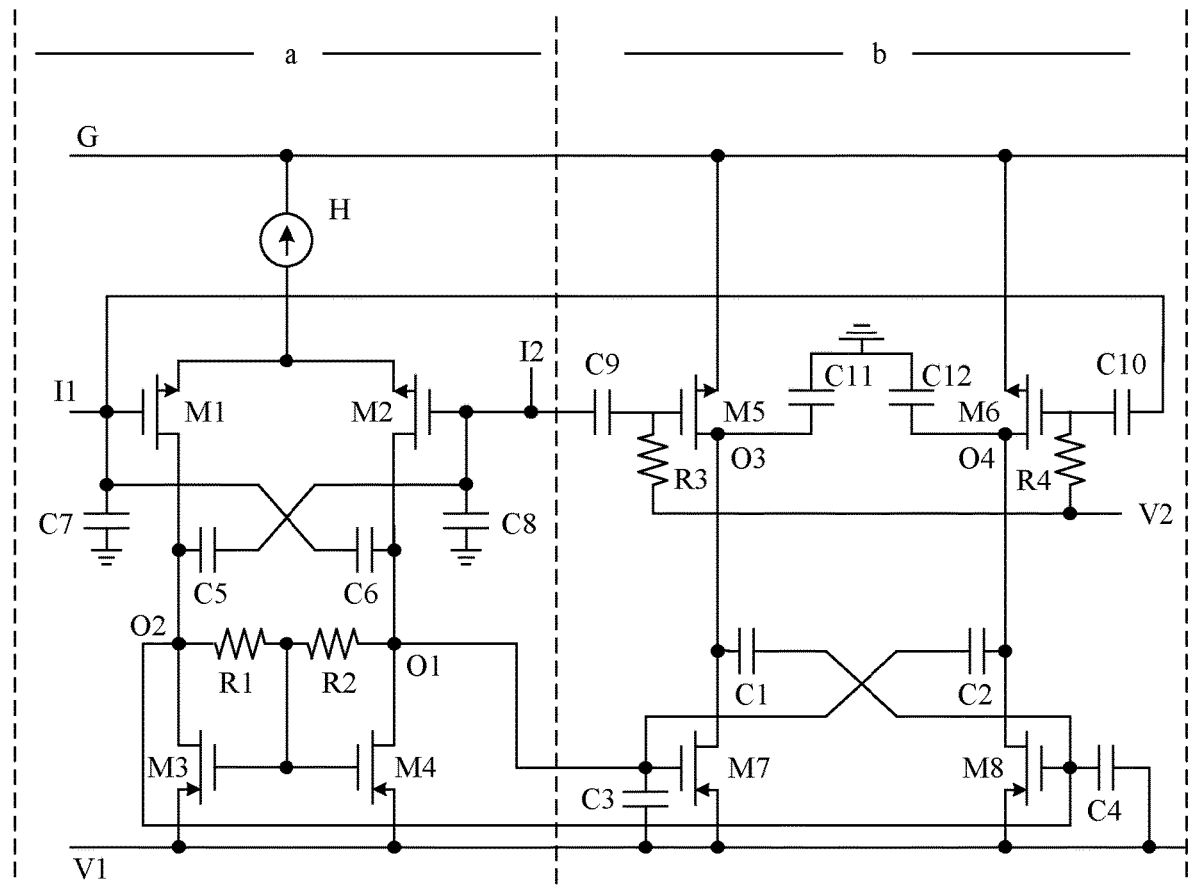
FIG. 5 is a schematic diagram of a structure of another operational amplifier according to an embodiment of this application.

Refer to FIG. 5. An embodiment of this application provides another operational amplifier. The operational amplifier provided in this embodiment includes a first amplifying unit a, a second amplifying unit b, a current source H, a first compensation capacitor C1, a second compensation capacitor C2, a third compensation capacitor C5, and a fourth compensation capacitor C6. A structure of the first amplifying unit a and a structure of the second amplifying unit b are respectively the same as the structure of the first amplifying unit a and the structure of the second amplifying unit b in the operational amplifier shown in FIG. 4. In addition, a coupling relationship among the first amplifying unit a, the second amplifying unit b, the current source H, the first compensation capacitor C1, the second compensation capacitor C2, the third compensation capacitor C5, and the fourth compensation capacitor C6 that are included in the operational amplifier provided in this embodiment is the same as the coupling relationship among the first amplifying unit a and the second amplifying unit b, the current source H, the first compensation capacitor C1, and the second compensation capacitor C2, the third compensation capacitor C5, and the fourth compensation capacitor C6 that are in the operational amplifier shown in FIG. 4. Refer to FIG. 4 and the descriptions in the foregoing embodiments. Details are not described herein again.

A difference between the operational amplifier provided in this embodiment and the operational amplifier shown in FIG. 4 lies in that a first transistor M1, a second transistor M2, a fifth transistor M5, and a sixth transistor M6 in the operational amplifier provided in this embodiment may all be N-type transistors, and a third transistor M3, a fourth transistor M4, a seventh transistor M7, and an eighth transistor M8 may all be P-type transistors.

In this way, one end of the current source H is grounded, and the other end of the current source H is coupled to a source of the first transistor M1 and a source of the second transistor M2. Both a source of the fifth transistor M5 and a source of the sixth transistor M6 are grounded, and a source of the third transistor M3, a source of the fourth transistor M4, a source of the seventh transistor M7, and a source of the eighth transistor M8 are all coupled to a first voltage end V1.

In this embodiment, because one end of the third compensation capacitor C5 is coupled to a drain of the first transistor M1, and the other end of the third compensation capacitor C5 is coupled to a gate of the second transistor M2, the third compensation capacitor C5 may partially or fully cancel capacitance of a third parasitic capacitor C7. In addition, because one end of the fourth compensation capacitor C6 is coupled to a gate of the first transistor M1, and the other end of the fourth compensation capacitor C6 is coupled to a drain of the second transistor M2, the fourth compensation capacitor C6 may partially or fully cancel capacitance of a fourth parasitic capacitor C8. In this way, stability of the operational amplifier can be increased.

In addition, in this embodiment, because one end of the first compensation capacitor C1 is coupled to a drain of the seventh transistor M7, the other end of the first compensation capacitor C1 is coupled to a gate of the eighth transistor M8, the first compensation capacitor C1 may partially or fully cancel capacitance of a first parasitic capacitor C3. In this way, load capacitance of a first output end of the first amplifying unit a is equal to L3−k1*L1, where L3 is a capacitance value of the first parasitic capacitor C3, L1 is a capacitance value of the first compensation capacitor C1, and k1 is an amplification multiple of the first compensation capacitor C1.

In addition, because one end of the second compensation capacitor C2 is coupled to a gate of the seventh transistor M7, and the other end of the second compensation capacitor C2 is coupled to a drain of the eighth transistor M8, the second compensation capacitor C2 may partially or completely cancel capacitance of a second parasitic capacitor C4. In this way, load capacitance of a second output end O2 of the first amplifying unit a is equal to L4−k2*L2, where L4 is a capacitance value of the second parasitic capacitor C4, L2 is a capacitance value of the second compensation capacitor C2, and k2 is an amplification multiple of the second compensation capacitor C2.

Compared with the operational amplifier shown in FIG. 1, the operational amplifier provided in this embodiment reduces the load capacitance of the first output end O1 of the first amplifying unit a and the load capacitance of the second output end O2 of the first amplifying unit a. This increases GBW of the operational amplifier.

Figure 6:
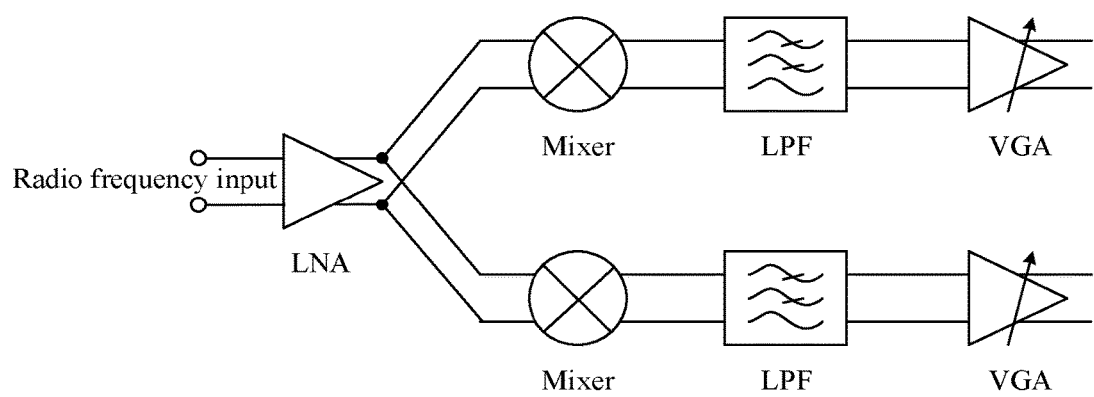
FIG. 6 is a schematic diagram of a structure of a radio frequency circuit according to an embodiment of this application.

An embodiment of this application provides a radio frequency circuit. The radio frequency circuit includes the operational amplifier provided in any one of the embodiments shown in FIG. 2 to FIG. 5. A person skilled in the art should know that the radio frequency circuit may usually be a receiver, a transmitter, or a transceiver that integrates receiving and transmitting functions. Refer to FIG. 6. The receiver is used as an example, and the receiver usually includes components such as a low-noise amplifier (LNA), a mixer, a low-pass filter (LPF), and a variable-gain amplifier (VGA). The operational amplifier provided in this application may be applied to these components, and further may be applied to the LPF and/or the VGA. However, the transmitter usually includes components such as a power amplifier (PA), a mixer, a LPF, and a VGA. The operational amplifier provided in this application may be applied to these components, and further may be applied to the LPF and/or the VGA. For application of the operational amplifier provided in this application in the transceiver, refer to the foregoing examples of the receiver or the transmitter. Details are not described again.

An embodiment of this application provides an electronic device. The electronic device includes the foregoing radio frequency circuit. Generally, the radio frequency circuit needs to be coupled to an antenna, to receive and send a radio signal. The electronic device may include a terminal device such as a mobile phone, a palmtop computer, a personal computer (PC), or a mobile PC, or may alternatively be another device that uses a radio frequency circuit to receive and send a signal, for example, a network device such as a base station or an access point. Examples are not listed one by one herein.

The foregoing descriptions are merely optional embodiments of this application, but are not intended to limit this application. Any modification, equivalent replacement, or improvement made without departing from the spirit and principle of this application shall fall within the protection scope of this application.

What is claimed is:

1. An operational amplifier, comprising:
   a first amplifying unit;
   a second amplifying unit coupled to the first amplifying unit;
   a current source coupled to the first amplifying unit and comprising:
      a first current source end; and
      a second current source end;
   a first compensation capacitor coupled to the second amplifying unit;
   a second compensation capacitor coupled to the second amplifying unit;
   a first input end coupled to the first current source end;
   a second input end;
   a first voltage input end coupled to the first amplifying unit and the second amplifying unit, wherein the first voltage input end is a first differential voltage signal input end; and
   a second voltage input end coupled to the first amplifying unit and the second amplifying unit, wherein the second voltage input end is a second differential voltage signal input end,
   wherein the first amplifying unit comprises:
      a first transistor coupled to the first voltage input end and comprising:
         a first source coupled to the second current source end;
         a first gate; and
         a first drain;
      a second transistor coupled to the second voltage input end and comprising:
         a second source coupled to the second current source end;
         a second gate; and
         a second drain;
      a third transistor comprising:
         a third source coupled to the second input end;
         a third gate; and
         a third drain; and
      a fourth transistor comprising:
         a fourth source coupled to the second input end;

a fourth gate coupled to the gate of the third transistor; and
a fourth drain,
wherein the second amplifying unit comprises:
a fifth transistor coupled to the second voltage input end and comprising:
a fifth source coupled to the first voltage end;
a fifth gate; and
a fifth drain coupled to the first compensation capacitor, wherein the fifth drain is a first differential voltage signal output end and configured to output a first signal;
a sixth transistor coupled to the first voltage input end and comprising:
a sixth source coupled to the first voltage end;
a sixth gate; and
a sixth drain coupled to the second compensation capacitor, wherein the sixth drain is a second differential voltage signal output end and configured to output a second signal that is different from the first signal;
a seventh transistor comprising:
a seventh source coupled to the second input end;
a seventh gate coupled to the second drain, the fourth drain, and the second compensation capacitor; and
a seventh drain coupled to the first compensation capacitor; and
an eighth transistor comprising:
an eighth source coupled to the second input end;
an eighth gate directly coupled to the first drain, the third drain, and the first compensation capacitor; and
an eighth drain coupled to the second compensation capacitor.

2. The operational amplifier of claim 1, wherein a first capacitance value of the first compensation capacitor is equal to a second capacitance value of the second compensation capacitor.

3. The operational amplifier of claim 1, wherein the first amplifying unit further comprises:
a first resistor comprising:
a first end coupled to the first drain and the third drain; and
a second end coupled to the third gate and the fourth gate; and
a second resistor comprising:
a first end coupled to the second end of the first resistor; and
a second end coupled to the second drain and the fourth drain.

4. The operational amplifier of claim 1, wherein the second amplifying unit further comprises:
a first capacitor including a first parasitic capacitance, wherein the first capacitor comprises:
a first end coupled the seventh gate; and
a second end coupled to the second input end; and
a second capacitor comprising including a second parasitic capacitance, wherein the second capacitor comprises:
a first end coupled to the eighth gate; and
a second end coupled to the second input end.

5. The operational amplifier of claim 1, wherein the operational amplifier further comprises:
a third compensation capacitor comprising:
a first end coupled to the first drain; and
a second end coupled to the second gate; and
a fourth compensation capacitor comprising:
a first end coupled to the second drain; and
a second end coupled to the first gate.

6. The operational amplifier of claim 5, wherein a third capacitance value of the third compensation capacitor is equal to a fourth capacitance value of the fourth compensation capacitor.

7. The operational amplifier of claim 1, wherein the first amplifying unit further comprises:
a third capacitor including a third parasitic capacitance, wherein the third capacitor comprises:
a first end coupled to the first gate; and
a second end coupled to a ground; and
a fourth capacitor including a fourth parasitic capacitance, wherein the fourth capacitor comprises:
a first end coupled to the second gate; and
a second end coupled to the ground.

8. The operational amplifier of claim 1, further comprising a second voltage end, wherein the second amplifying unit further comprises:
a first input capacitor comprising:
a first end coupled to the second gate; and
a second end coupled to the fifth gate;
a second input capacitor comprising:
a first end coupled to the first gate; and
a second end coupled to the sixth gate;
a third resistor comprising:
a first end coupled to the second end of the first input capacitor; and
a second end coupled to the second voltage end; and
a fourth resistor comprising:
a first end coupled to the second end of the second input capacitor; and
a second end coupled to the second voltage end.

9. The operational amplifier of claim 1, wherein the first input end is a first voltage end and the second input end is a ground end, wherein the first transistor, the second transistor, the fifth transistor, and the sixth transistor are all P-type transistors, and wherein the third transistor, the fourth transistor, the seventh transistor, and the eighth transistor are all N-type transistors.

10. The operational amplifier of claim 1, wherein the first input end is a ground end and the second input end is a first voltage end, wherein the first transistor, the second transistor, the fifth transistor, and the sixth transistor are all N-type transistors, and wherein the third transistor, the fourth transistor, the seventh transistor, and the eighth transistor are all P-type transistors.

11. The operational amplifier of claim 1, wherein a first amplification coefficient of the first transistor is equal to a second amplification coefficient of the second transistor, a third amplification coefficient of the third transistor is equal to a fourth amplification coefficient of the fourth transistor, a fifth amplification coefficient of the fifth transistor is equal to a sixth amplification coefficient of the sixth transistor, and a seventh amplification coefficient of the seventh transistor is equal to an eighth amplification coefficient of the eighth transistor.

12. A radio frequency circuit comprising:
an operational amplifier comprising:
a first amplifying unit;
a second amplifying unit coupled to the first amplifying unit;
a current source coupled to the first amplifying unit and comprising:
a first current source end; and
a second current source end;

a first compensation capacitor coupled to the second amplifying unit;
a second compensation capacitor coupled to the second amplifying unit;
a first input end coupled to the first current source end;
a second input end;
a first voltage input end coupled to the first amplifying unit and the second amplifying unit, wherein the first voltage input end is a first differential voltage signal input end; and
a second voltage input end coupled to the first amplifying unit and the second amplifying unit, wherein the second voltage input end is a second differential voltage signal input end,
wherein the first amplifying unit comprises:
  a first transistor coupled to the first voltage input end and comprising:
    a first source coupled to the second current source end;
    a first gate; and
    a first drain;
  a second transistor coupled to the second voltage input end and comprising:
    a second source coupled to the second current source end;
    a second gate; and
    a second drain;
  a third transistor comprising:
    a third source coupled to the second input end;
    a third gate; and
    a third drain; and
  a fourth transistor comprising:
    a fourth source coupled to the second input end;
    a fourth gate coupled to the third gate; and
    a fourth drain,
wherein the second amplifying unit comprises:
  a fifth transistor coupled to the second voltage input end and comprising:
    a fifth source coupled to the first voltage end;
    a fifth gate; and
    a fifth drain coupled to the first compensation capacitor, wherein the fifth drain is a first differential voltage signal output end and configured to output a first signal;
  a sixth transistor coupled to the first voltage input end and comprising:
    a sixth source coupled to the first voltage end;
    a sixth gate; and
    a sixth drain coupled to the second compensation capacitor, wherein the sixth drain is a second differential voltage signal output end and configured to output a second signal that is different from the first signal;
  a seventh transistor comprising:
    a seventh source coupled to the second input end;
    a seventh gate coupled to the second drain, the fourth drain, and the second compensation capacitor; and
    a seventh drain coupled to the first compensation capacitor; and
  an eighth transistor comprising:
    an eighth source coupled to the second input end;
    an eighth gate directly coupled to the first drain, the third drain, and the first compensation capacitor; and
    an eighth drain coupled to the second compensation capacitor.

13. An electronic device comprising:
a radio frequency circuit comprising an operational amplifier, wherein the operational amplifier comprises:
  a first amplifying unit;
  a second amplifying unit coupled to the first amplifying unit;
  a current source coupled to the first amplifying unit and comprising:
    a first current source end; and
    a second current source end;
  a first compensation capacitor coupled to the second amplifying unit;
  a second compensation capacitor coupled to the second amplifying unit;
  a first input end coupled to the first current source end;
  a second input end;
  a first voltage input end coupled to the first amplifying unit and the second amplifying unit, wherein the first voltage input end is a first differential voltage signal input end; and
  a second voltage input end coupled to the first amplifying unit and the second amplifying unit, wherein the second voltage input end is a second differential voltage signal input end,
wherein the first amplifying unit comprises:
  a first transistor coupled to the first voltage input end and comprising:
    a first source coupled to the second current source end;
    a first gate; and
    a first drain;
  a second transistor coupled to the second voltage input end and comprising:
    a second source coupled to the second current source end;
    a second gate; and
    a second drain;
  a third transistor comprising:
    a third source coupled to the second input end;
    a third gate; and
    a third drain; and
  a fourth transistor comprising:
    a fourth source coupled to the second input end;
    a fourth gate coupled to the third gate; and
    a fourth drain,
wherein the second amplifying unit comprises:
  a fifth transistor coupled to the second voltage input end and comprising:
    a fifth source coupled to the first voltage end;
    a fifth gate; and
    a fifth drain coupled to the first compensation capacitor, wherein the fifth drain is a first differential voltage signal output end and configured to output a first signal;
  a sixth transistor coupled to the first voltage input end and comprising:
    a sixth source coupled to the first voltage end;
    a sixth gate; and
    a sixth drain coupled to the second compensation capacitor, wherein the sixth drain is a second differential voltage signal output end and configured to output a second signal that is different from the first signal;
  a seventh transistor comprising:
    a seventh source coupled to the second input end;
    a seventh gate coupled to the second drain, the fourth drain, and the second compensation capacitor; and a seventh drain coupled to the first compensation capacitor; and
an eighth transistor comprising:
an eighth source coupled to the second input end;
an eighth gate directly coupled to the first drain, the third drain, and the first compensation capacitor; and
an eighth drain coupled to the second compensation capacitor.

14. The radio frequency circuit of claim 12, wherein a first capacitance value of the first compensation capacitor is equal to a second capacitance value of the second compensation capacitor.

15. The radio frequency circuit of claim 12, wherein the first amplifying unit further comprises:
a first resistor comprising:
a first end coupled to the first drain and the third drain; and
a second end coupled to the third gate and the fourth gate; and
a second resistor comprising:
a first end coupled to the second end of the first resistor; and
a second end coupled to the second drain and the fourth drain.

16. The radio frequency circuit of claim 12, wherein the second amplifying unit further comprises:
a first capacitor including a first parasitic capacitance, wherein the first capacitor comprises:
a first end coupled the seventh gate; and
a second end coupled to the second input end; and
a second capacitor including a second parasitic capacitance, wherein the second capacitor comprises:
a first end coupled to the eighth gate; and
a second end coupled to the second input end.

17. The radio frequency circuit of claim 12, wherein the operational amplifier further comprises:
a third compensation capacitor comprising:
a first end coupled to the first drain; and
a second end coupled to the second gate; and
a fourth compensation capacitor comprising:
a first end coupled to the second drain; and
a second end coupled to the first gate.

18. The radio frequency circuit of claim 17, wherein a third capacitance value of the third compensation capacitor is equal to a fourth capacitance value of the fourth compensation capacitor.

19. The radio frequency circuit of claim 12, wherein the first amplifying unit further comprises:
a third parasitic capacitor comprising:
a first end coupled to the first gate; and
a second end coupled to a ground; and
a fourth parasitic capacitor comprising:
a first end coupled to the second gate; and
a second end coupled to the ground.

20. The radio frequency circuit of claim 12, wherein the operational amplifier further comprises a second voltage end, wherein the second amplifying unit further comprises:
a first input capacitor comprising:
a first end coupled to the second gate; and
a second end coupled to the fifth gate;
a second input capacitor comprising:
a first end coupled to the first gate; and
a second end coupled to the sixth gate;
a third resistor comprising:
a first end coupled to the second end of the first input capacitor; and
a second end coupled to the second voltage end; and
a fourth resistor comprising:
a first end coupled to the second end of the second input capacitor; and
a second end coupled to the second voltage end.

* * * * *